United States Patent
Yi et al.

(10) Patent No.: US 11,837,998 B2
(45) Date of Patent: Dec. 5, 2023

(54) GAIN COMPRESSION COMPENSATION CIRCUIT OF RADIO FREQUENCY POWER AMPLIFIER

(71) Applicant: SMARTER MICROELECTRONICS (GUANG ZHOU) CO., LTD., Guangzhou (CN)

(72) Inventors: Jiangtao Yi, Guangzhou (CN); Qiang Su, Guangzhou (CN); Huadong Wen, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 518 days.

(21) Appl. No.: 17/138,869

(22) Filed: Dec. 30, 2020

(65) Prior Publication Data
US 2021/0194441 A1 Jun. 24, 2021

Related U.S. Application Data

(63) Continuation of application No. PCT/CN2020/115160, filed on Sep. 14, 2020.

(30) Foreign Application Priority Data

Dec. 19, 2019 (CN) .......................... 201911317163.1

(51) Int. Cl.
  *H03F 1/22* (2006.01)
  *H03F 3/195* (2006.01)
  *H03F 3/24* (2006.01)

(52) U.S. Cl.
  CPC ............. *H03F 3/195* (2013.01); *H03F 3/245* (2013.01); *H03F 2200/168* (2013.01); *H03F 2200/451* (2013.01); *H03F 2200/99* (2013.01)

(58) Field of Classification Search
  CPC ..................................... H03F 1/22; H03F 3/04
  USPC ................................................. 330/288, 311
  See application file for complete search history.

(56) References Cited

U.S. PATENT DOCUMENTS

| | | | | |
|---|---|---|---|---|
| 7,482,876 B2* | 1/2009 | Asam | ....................... | H03F 3/343 330/296 |
| 7,714,659 B2* | 5/2010 | Leitner | .................... | H03F 3/195 330/296 |
| 7,999,619 B2* | 8/2011 | Draxelmayr | ........ | H03F 3/45475 330/288 |
| 2004/0085130 A1* | 5/2004 | Luo | ........................ | H03F 3/3432 330/288 |

\* cited by examiner

*Primary Examiner* — Henry Choe
(74) *Attorney, Agent, or Firm* — SYNCODA LLC; Feng Ma

(57) ABSTRACT

A gain compression compensation circuit of a radio frequency power amplifier includes: a low-pass filtering module configured to receive a part of radio frequency signals output from a first power amplification transistor and to filter, from the part of radio frequency signals, radio frequency signals with a frequency above a fundamental wave to obtain a filtered signal; and a rectifying module configured to receive the filtered signal output by the low-pass filtering module and to rectify the filtered signal to obtain a rectified current; and to output the rectified current to a bias transistor and superimpose the rectified current with a bias current $I_{bias}$ to flow into the bias transistor.

18 Claims, 5 Drawing Sheets

GAIN COMPRESSION COMPENSATION CIRCUIT OF RADIO FREQUENCY POWER AMPLIFIER

CROSS-REFERENCE TO RELATED APPLICATIONS

This application is a continuation of International Application No. PCT/CN2020/115160 filed on Sep. 14, 2020, which claims priority to Chinese Patent Application No. 201911317163.1 filed on Dec. 19, 2019. The disclosures of these applications are hereby incorporated by reference in their entirety.

BACKGROUND

With the development of mobile communication technology, modern mobile communication standards adopt more complex modulation methods in order to meet the needs of larger bandwidth and higher data transmission rate. The time-varying envelope signals used in these modulation technologies put forward stricter linear indexes for the design of Power Amplifier (PA). The power amplifier generally should have a lower adjacent channel power rejection ratio to minimize spectrum regeneration and maintain modulation accuracy.

SUMMARY

The present disclosure relates generally to the field of power amplification, and more specifically to a gain compression compensation circuit.

Some embodiments of the disclosure provide a gain compression compensation circuit, and the circuit includes:
- a low-pass filtering module configured to receive a part of radio frequency signals output from a first power amplification transistor and to filter, from the part of radio frequency signals, radio frequency signals with a frequency above a fundamental wave to obtain a filtered signal; and the first power amplification transistor includes a first MOSFET MOS1 or a first heterojunction bipolar transistor (HBT) HBT1; and
- a rectifying module configured to receive the filtered signal output by the low-pass filtering module and to rectify the filtered signal to obtain a rectified current; and to output the rectified current to a bias transistor and superimpose the rectified current with a current $I_{bias}$ to flow into the bias transistor; and the bias transistor includes a second MOSFET MOS0 or a second HBT HBT0.

In the above solution, the low-pass filtering module includes a first resistor and a first capacitor;

Herein, a first end of the first resistor is connected with the first power amplification transistor, and a second end of the first resistor is connected with the rectifying module; and A first end of the first capacitor is connected between a second end of the first resistor and the rectifying module, and a second end of the first capacitor is grounded.

In the above solution, the first end of the first resistor is connected with the drain of the MOS1 or the collector of the HBT1.

In the above solution, the rectifying module includes a diode and a second resistor;

Herein, a forward direction end of the diode is connected with the second end of the first resistor, and a reverse direction end of the diode is connected with the second resistor in series, while the second resistor is connected with the bias transistor.

In the above solution, the second resistor is connected with the gate of the MOS0 or the base of the HBT0.

In the above solution, the low-pass filtering module is configured to filter, from feedback radio frequency signals of the first power amplification transistor, signals with a frequency above the fundamental frequency.

In the above solution, the diode of the rectifying module is configured to be turned on when a voltage amplitude of a radio frequency voltage signal in the radio frequency signals received is higher than a turn-on voltage of the diode, and to be turned off when the voltage amplitude of the radio frequency voltage signal received is lower than the turn-on voltage of the diode.

In the above solution, the diode of the rectifying module is configured to convert the filtered signal into a periodic rectified current through rectification effect.

In the above solution, the circuit further includes a second power amplification transistor; and the second power amplification transistor includes a third MOSFET MOS2 or a third HBT HBT2; herein, the source of the MOS2 is connected with the drain of the MOS1; or, the emitter of the HBT2 is connected with the collector of the HBT1.

In the above solution, the second power amplification transistor is configured to be connected with an external power supply and share an output radio frequency voltage with the first power amplification transistor.

According to the gain compression compensation circuit provided by the embodiments of the disclosure, the feedback component of the radio frequency signal output by the first power amplification transistor is low-pass filtered and rectified through the low-pass filtering module and the rectifying module of the circuit, respectively, and the obtained rectified current is superimposed with the current $I_{bias}$ to flow into the bias transistor. In this way, it is possible to dynamically compensate the voltage (i.e., $V_{gs}$ or $V_{be}$) that controls the static operating point of the first power amplification transistor, thus compensating the gain compression of the first power amplification transistor and the second power amplification transistor with the increase of the output power, and further ensuring that the operating point of the power amplification transistor does not drop significantly at high power.

DETAILED DESCRIPTION

In order to make the purpose, technical solutions and advantages of the embodiments of the disclosure clearer, the technical solutions of the embodiments of the disclosure will be described clearly and completely below with reference to the drawings of the embodiments of the disclosure, and apparently, the described embodiments are a part of the embodiments of the disclosure, not all of them.

A power amplifier can be composed of transistors, and the gate voltage $V_{gs}$ controlling the signal of the static operating point of the amplifier, such as the MOSFET (Metal-Oxide-Semiconductor Field-Effect Transistor, abbreviated as MOS), exhibits non-linear change with the increase of the input power, that is, with the increase of the input power, the voltage tend to drop, resulting in that the large signal bias point of power amplification transistor is reduced therewith, so under the condition of the same output power, in a swing period of radio frequency signal, the power amplification transistor is more likely to enter the non-linear operating region, resulting in occurrence of advance gain compression and thus occurrence of non-linear distortion.

Figure 1:
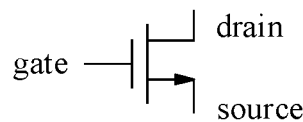
FIG. 1 is a schematic diagram of the structure of an n-type MOSFET (NMOSFET) according to some embodiments.

Taking the MOS PA in in FIG. 1 as an example, a single MOS transistor includes a gate, a drain and a source, with voltage-dependent non-linear parasitic capacitances $C_{gs}$, $C_{gd}$, and $C_{ds}$ between two of them. For the input signal $RF_{in}$ or the input voltage $V_{in}$, the observed input impedance $Z_{in}$ will be affected by these non-linear capacitances, which further causes the voltage that controls the static bias point of the amplifier, i.e. the voltage $V_{gs}$ between the gate and the source to exhibit non-linear changes with the increase of the input power.

Figure 2:
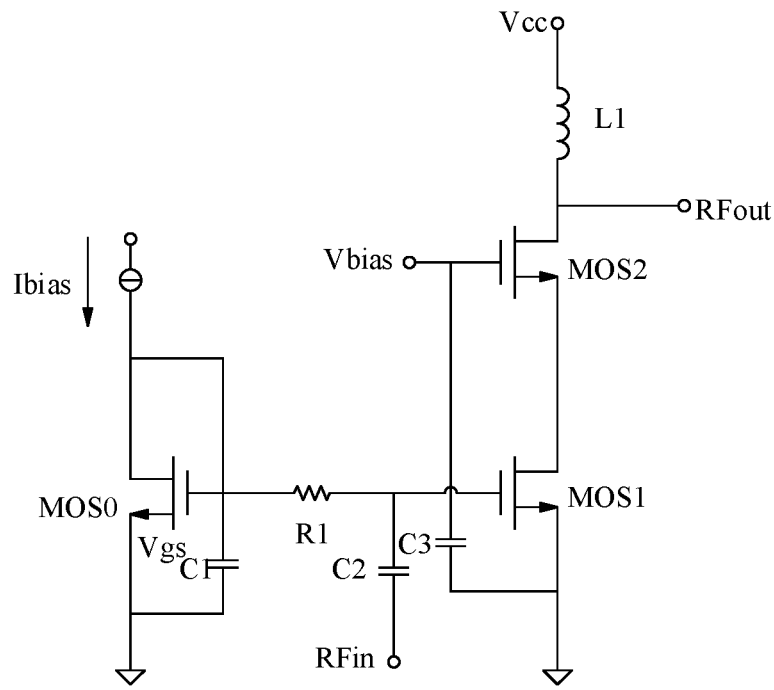
FIG. 2 is a schematic diagram of the structure of a conventional MOS PA according to some embodiments.

When the voltage or current flowing into the drain of the MOS transistor is too high, the MOS transistor will be broken down, i.e., thermal breakdown occurs, and thus a typical design structure of the MOS PA is illustrated in FIG. 2. In FIG. 2, the second power amplification transistor MOS2 is configured to share the radio frequency voltage on the first power amplification transistor MOS1, that is, the second power amplification transistor MOS2 is configured to provide the radio frequency voltage-division function and to improve the isolation level between the input and the output, and the bias transistor MOS0 is configured to provide DC bias, and the first power amplification transistor MOS1 mainly plays an amplifying role.

Figure 3:
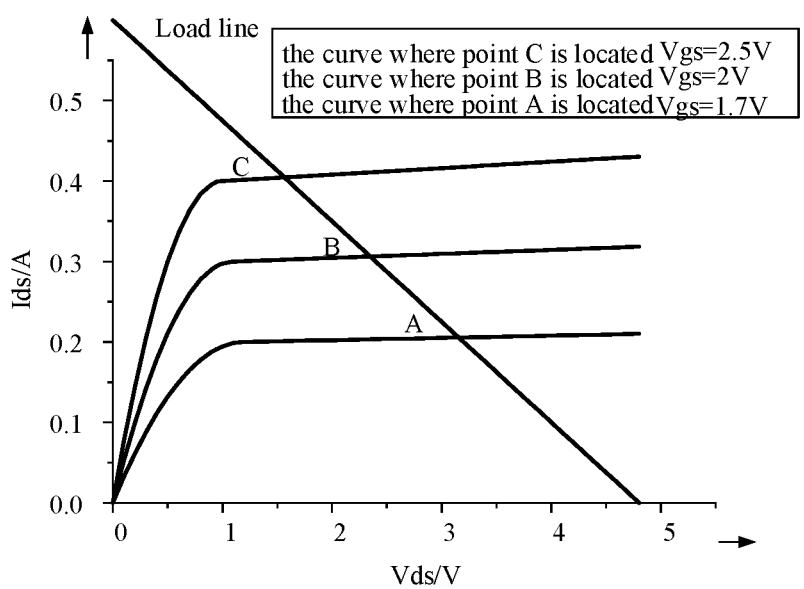
FIG. 3 is a schematic diagram of the principle of a static bias operating point affecting the relationship curve between the gain of a power amplifier and the change of output power.

In addition to the inherent non-linear characteristics of the MOS transistor as illustrated in FIG. 1, for the conventional structure of MOS PA as illustrated in FIG. 2, the amplitude of the output radio frequency voltage component of the inductor (with resistance) at the source of the first power amplification transistor MOS1 also has an obvious influence on the static bias gate voltage $V_{gs}$ of the MOS1, which leads to the non-linear drop of $V_{gs}$ of the MOS1 with the increase of $RF_{in}$, please see FIG. 3 for the specific principle.

Figure 4:
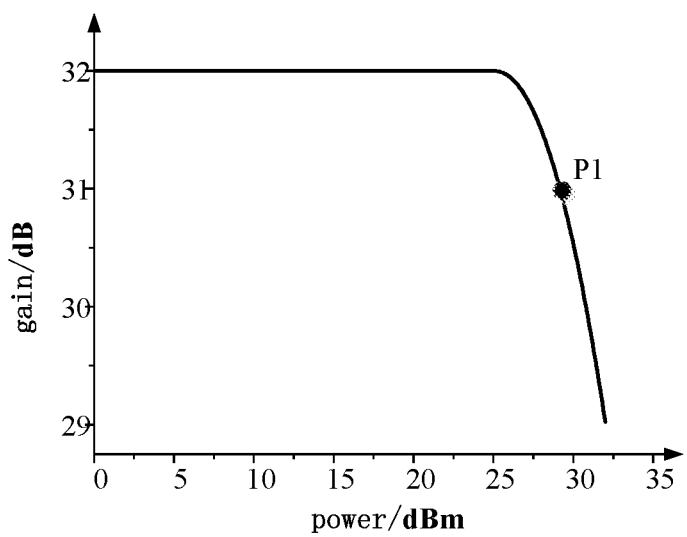
FIG. 4 is a schematic diagram of the relationship curve between the gain of the power amplifier of a typical MOS PA and the change of output power according to some embodiments.

FIG. 3 is a schematic diagram of the principle of a static bias operating point affecting the relationship curve between the gain and the change of output power, for a typical power amplifier. As illustrated in FIG. 3, the expected design of original static bias operating point is at point B, but since the voltage $V_{gs}$ that controls the static operating point drops non-linearly with the input power, the operating point under a large signal will move toward point A, and the amplitude of $V_{ds}$ required by the same output power is larger, so that the first power amplification transistor MOS1 in FIG. 2 may easily enter the non-linear operating region, i.e., the triode region and even the deep triode region, and the output resistance of the amplification transistor becomes smaller and the gain thereof decreases, and then the gain compression phenomenon occurs, and FIG. 4 illustrated the relationship curve between the gain of the power amplifier of a typical MOS PA and the change of output power. The power point $P_{1dB}$ with the gain dropping down 1 dB may be configured to measure the linearity of the power amplifier, and when the gain is compressed early, the $P_{1dB}$ is usually not too high to guarantee the linearity of the amplified signal.

For this purpose, the following technical solutions of the embodiments of the disclosure are proposed.

Figure 5:
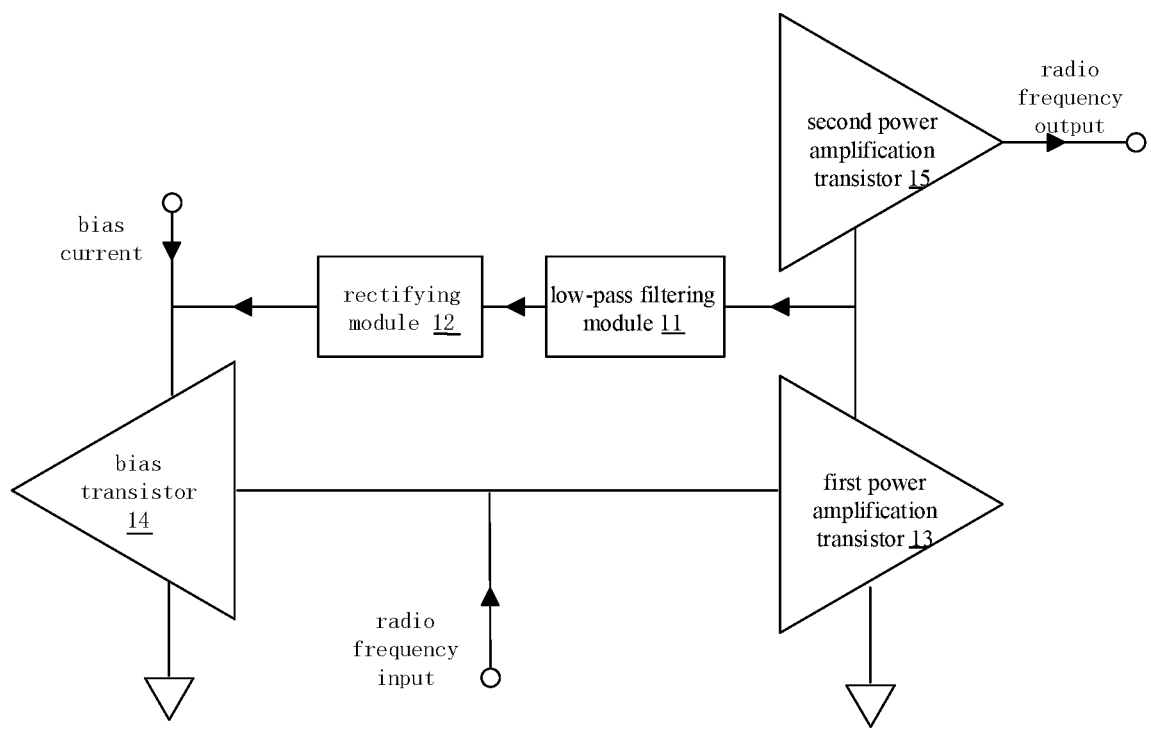
FIG. 5 is a block diagram of the structure of a gain compression compensation circuit provided by an embodiment of the disclosure.

The embodiment of the disclosure provides a block diagram of the structure of a gain compression compensation circuit of a radio frequency power amplifier, as illustrated in FIG. 5, and the circuit includes:

a low-pass filtering module 11 configured to receive a part of radio frequency signals output from a first power amplification transistor 13 and to filter, from the part of radio frequency signals, radio frequency signals with a frequency above a fundamental wave to obtain a filtered signal; and the first power amplification transistor 13 includes MOS1 or HBT1; and a rectifying module 12 configured to receive the filtered signal output by the low-pass filtering module and to rectify the filtered signal to obtain a rectified current; and to output the rectified current to a bias transistor 14 and superimpose the rectified current with a current $I_{bias}$ to flowing into the bias transistor 14; and the bias transistor 14 includes MOS0 or HBT0.

Transistors mentioned in the disclosure may be metal-oxide-semiconductor field effect transistors, i.e., MOSFET transistors, or heterojunction bipolar transistors, i.e., HBT transistors.

The low-pass filtering module includes a first resistor and a first capacitor, and the rectifying module includes a diode and a second resistor. Due to the non-linear characteristics of the transistor, the radio frequency signals output from the first power amplification transistor 13 have different frequency components. After passing through the low-pass filtering module, the components with a frequency above the fundamental wave are filtered out to obtain a filtered signal; and these filtered signals are input to the rectifying module and rectified at the diode to obtain a periodic rectified current.

The circuit further includes: a second power amplification transistor 15; and the second power amplification transistor 15 includes MOS2 or HBT2; herein, the source of the MOS2 is connected with the drain of the MOS1; or, the emitter of the HBT2 is connected with the collector of the HBT1. The second power amplification transistor 15 is configured to be connected with an external power supply and share an output radio frequency voltage with the first power amplification transistor.

The periodic rectified current is superimposed with the current $I_{bias}$ to flow into the bias transistor 14, thereby periodically increasing the current flowing into the bias transistor 14. Therefore the signal that controls the static operating point of the amplifier is increased. Exemplarily, when the transistor of the amplifier is a MOS transistor, the signal $V_{gs}$ that controls the static operating point of the MOS transistor amplifier will also increase periodically accordingly, thus slowing down the drop of $V_{gs}$ with the increase of the input power; and when the transistor of the amplifier is a HBT transistor, the base current $I_b$ that controls the static operating point of the HBT transistor amplifier will also increase, thus slowing down the drop of $I_b$ with the increase of the input power.

According to a gain compression compensation technology provided by the embodiment of the disclosure, the radio frequency signal fed back from the output is filtered and rectified through the low-pass filtering module and the rectifying module of the circuit, and the obtained rectified current is superimposed with the current $I_{bias}$ to flow into the bias transistor 14. In this way, the drop of the static bias operating point of the first power amplification transistor 13 is compensated by increasing the current $I_{bias}$ of the bias transistor 14, thereby compensating the compression of the gain of the whole radio frequency power amplifier with the increase of the output power.

Figure 6:
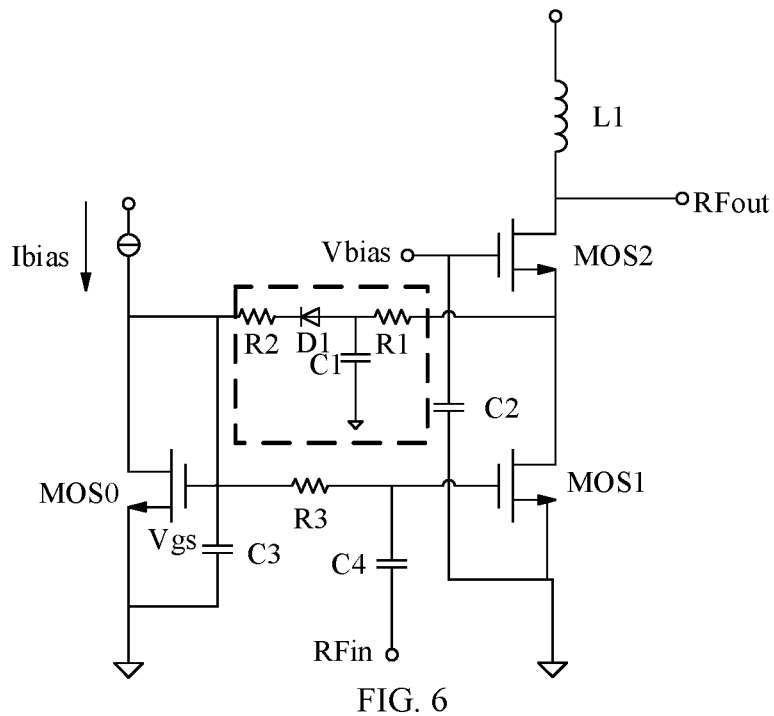
FIG. 6 is a schematic diagram of the structure of a gain compression compensation circuit of a conventional MOS PA provided by an embodiment of the disclosure.

As illustrated in FIG. 6, an embodiment of the disclosure provides an implementation of a gain compression compensation technology, and the circuit includes:

a low-pass filtering module configured to receive a part of radio frequency signals output from a first power amplification transistor and to filter, from the part of radio frequency signals, radio frequency signals with a frequency above a fundamental wave to obtain a filtered signal; and the first power amplification transistor includes MOS1 or HBT1; and a rectifying module configured to receive the filtered signal output by the low-pass filtering module and to rectify the filtered signal to obtain a rectified current; and to output the rectified current to a bias transistor and superimpose the rectified current with a current $I_{bias}$ to flow into the bias transistor.

As illustrated in FIG. 6, the embodiment takes a MOS transistor as an example.

The low-pass filtering module includes a first resistor R1 and a first capacitor C1, and the rectifying module includes a diode D1 and a second resistor R2. The low-pass filtering module receives a part of radio frequency signals output by the first power amplification transistor MOS1, and filters out the high frequency signals therefrom to obtain a filtered signal. The rectifying module receives the filtered signal output by the low-pass filtering module and rectifies the filtered signal to obtain a rectified current; and then outputs the rectified current to a bias transistor MOS0, and the rectified current superimposes with a current $I_{bias}$ to flow into the drain of the bias transistor MOS0.

The circuit further includes: a second power amplification transistor; herein, the source of the second power amplification transistor is connected with the drain of the first transistor, and the first power amplification transistor is connected with the bias transistor.

As illustrated in FIG. 6, the drain of the first power amplification transistor MOS1 is connected with the source of the second power amplification transistor MOS2, and the gate of the first power amplification transistor MOS1 is connected with the gate of the bias transistor MOS0, and when the current of the drain of the bias transistor MOS0 increases, the $V_{gs}$ of the MOS1 will increase.

As illustrated in FIG. 6, the second power amplification transistor is configured to be connected with an external power supply Vcc, and since there is a limit of the voltage that the MOS transistor may bear inherently, the second power amplification transistor MOS2 is employed to provide voltage division for the radio frequency voltage on the first power amplification transistor MOS1 when the output power increases.

The low-pass filtering module is connected with the drain of the first power amplification transistor MOS1; and the rectifying module is connected with the drain of the bias transistor MOS0.

The low-pass filtering module includes a first resistor and a first capacitor; herein, a first end of the first resistor is connected with the first power amplification transistor, and a second end of the first resistor is connected with the rectifying module; and a first end of the first capacitor is connected between a second end of the first resistor and the rectifying module, and a second end of the first capacitor is grounded.

The rectifying module includes a diode and a second resistor; herein, a forward direction end of the diode is connected with the second end of the first resistor, and a reverse direction end of the diode is connected with the second resistor in series, while the second resistor is connected with the bias transistor.

Specifically, as illustrated in the gain compression compensation circuit provided in FIG. 6, the low-pass filtering module includes a first resistor R1 and a first capacitor C1, and the rectifying module includes a diode D1 and a second resistor R2. Herein, the reverse direction end of the diode D1 is connected with the second resistor R2 in series. A first end of the first resistor R1 of the low-pass filtering module is connected with the source of the second power amplification transistor MOS2, and a second end of the second resistor R2 of the rectifying module is connected with the drain of the bias transistor MOS0. A second end of the first resistor R1 is connected with the forward direction end of the diode D1 of the rectifying module, and a first end of the first capacitor C1 is connected between the second end of the first resistor R1 and the forward direction end of the diode D1, and a second end of the first capacitor C1 is grounded.

As illustrated in FIG. 6, due to the non-linear characteristics of the transistor, the output signal, i.e., the radio frequency signal flowing from the first power amplification transistor MOS1, has frequency components that are different from those of the input signal, and include higher harmonics and intermodulation components. After the signal passes through the low-pass filtering modules R1 and C1, the first part of frequency components with a frequency above the frequency of the fundamental wave, i.e., higher harmonics and intermodulation components, are filtered out, and the remaining second part of frequency components are input to the rectifying modules D1 and R2 as a filtered signal, and these filtered signals are rectified at the diode D1 by the rectification effect of the diode D1 to obtain a periodic rectified current.

The diode of the rectifying module is configured to be turned on when a voltage amplitude of the received filtered signal is higher than a turn-on voltage of the diode; and to be turned off when the voltage amplitude of the received filtered signal is lower than the turn-on voltage of the diode.

The diode of the rectifying module is configured to convert the filtered signal into a periodic rectified current by rectification effect when it is turned on.

In FIG. 6, when the diode D1 of the rectifying module is turned on, since the turn-on time period is not a complete period of the radio frequency signal filtered by the low-pass filtering module, but is a time period when the voltage amplitude exceeds the forward turn-on voltage of the diode D1, therefore, after the rectification effect of the diode D1, the obtained DC component, i.e. the rectified current, is also periodical, and it may be understood that the period of the rectified current is less than the complete period of the radio frequency signal, and the rectified current exists in a time period with a large radio frequency amplitude under high power. Superimposing such periodic rectified current with the current $I_{bias}$ to flow into the drain of the bias transistor MOS0 may periodically increase the current flowing in from the drain of the bias transistor MOS0.

At this time, since the MOS transistor amplifier operates in a linear region, the equivalent resistance may be considered to be approximately unchanged, so when the current flowing in from the drain of the bias transistor MOS0 increases, the gate voltage $V_{gs}$ that controls the static operating point of the amplifier will increase, thus compensating for the droping of $V_{gs}$ with the increase of the output power. The embodiment of the disclosure may stabilize the bias point under large signal at point B in FIG. 3, and even move it toward point C, thus improving the advance compression of the gain of the amplification circuit, and improving the point of the gain compression of 1 dB (P1 dB) and linearity.

Figure 7:
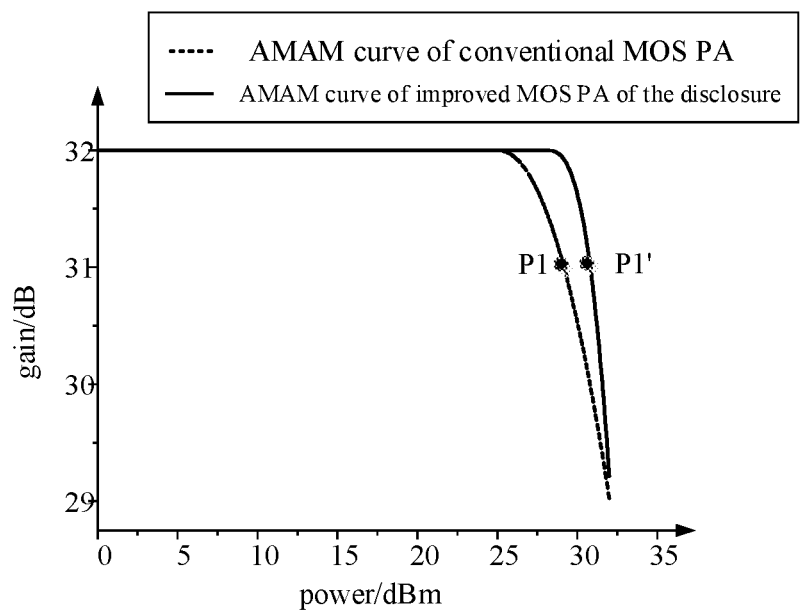
FIG. 7 is a diagram of comparison of the relationship between the gain of the power amplifier and the change of output power before and after applying the gain compression compensation circuit provided by an embodiment of the disclosure.

FIG. 7 is a diagram of comparison of the relationship between the gain of the power amplifier and the change of output power obtained after applying the gain compression compensation circuit provided by an embodiment of the disclosure with the effect before raising, and exemplarily, the corresponding output power point (P1 dB) of the gain compression of 1 dB before compensation is located at point P1, and the power point (P1 dB) is raised to point P1' after applying the compensation circuit of the disclosure, that is, after compensation, the gain compression of the radio frequency power amplifier under large signal is delayed.

Figure 8:
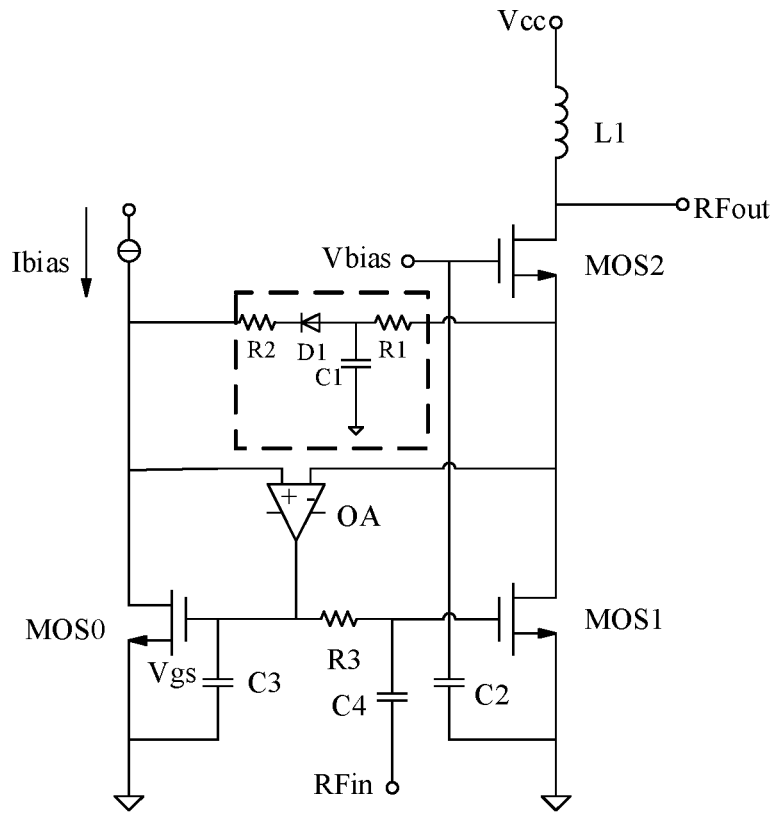
FIG. 8 is a schematic diagram of the structure of a gain compression compensation circuit of another MOS PA provided by an embodiment of the disclosure.

The embodiment of the disclosure is also applicable to another structure of MOS PA as illustrated in FIG. 8, and compared with FIG. 6, the structure in FIG. 8 has one more operational amplifier OA, which has high gain, and may realize that under the condition of small input current, only a small current exists between the source of the second power amplification transistor MOS2 and the drain of the bias transistor MOS0, as illustrated in FIG. 8, while a larger voltage is output between the bias transistor MOS0 and the first power amplification transistor MOS1.

According to a gain compression compensation technology provided by the embodiment of the disclosure, the received radio frequency signal is filtered and rectified through the low-pass filtering module and the rectifying module of the circuit, and the obtained rectified current is superimposed with the current $I_{bias}$ to flow into the bias transistor. In this way, the signal $V_{gs}$ that controls the static operating point of the amplifier is increased by increasing the current of the bias transistor, thus compensating for the drop of the signal $V_{gs}$ in the transistor with the increase of the input power.

Figure 9:
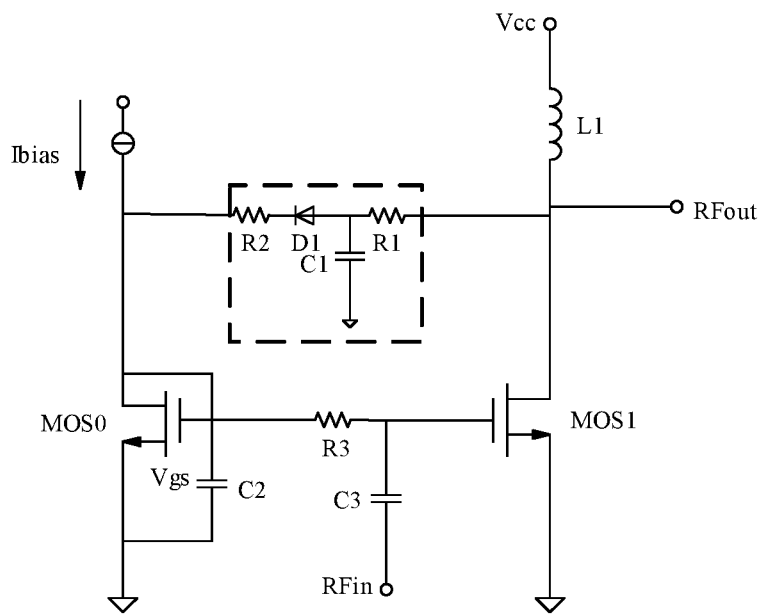
FIG. 9 is a schematic diagram of the structure of a gain compression compensation circuit of a single-transistor MOS PA provided by an embodiment of the disclosure.

The embodiment of the disclosure provides an implementation of a gain compression compensation technology, compared with the conventional MOS PA, such structure as illustrated in FIG. 9 has smaller output power, so the transistors configured as radio frequency voltage division are omitted, and by default, the radio frequency voltage or current at the drain of the first power amplification transistor MOS1 in FIG. 9 will not cause breakdown of the first power amplification transistor MOS1.

A low-pass filtering module configured to receive a part of radio frequency signals output by a first power amplification transistor and to filter, from the part of radio frequency signals, radio frequency signals with a frequency above a fundamental wave to obtain a filtered signal; and A rectifying module, configured to receive the filtered signal output by the low-pass filtering module and to rectify the filtered signal to obtain a rectified current; and to output the rectified current to a bias transistor and superimpose the rectified current with a current $I_{bias}$ to flow into the bias transistor.

Based on FIG. 9, in the structure of a single-transistor MOS PA gain compression compensation technology of the embodiment of the disclosure, the external voltage Vcc provides the voltage for the first power amplification transistor MOS1, and since there are still higher harmonics and intermodulation components in the radio frequency signal at this time, a filtering module and a rectifying module are added between the first power amplification transistor MOS1 and the bias transistor MOS0. At this time, the first resistor R1 and the first capacitor C1 in FIG. 9 may be considered as a low-pass filtering module, and the first resistor R1 is connected with the drain of the first power amplification transistor MOS1; and the diode D1 and the second resistor R2 in FIG. 9 are considered as a rectifying module, and the second resistor R2 is connected with the drain of the bias transistor MOS0.

The low-pass filtering module filters out, from the received radio frequency signal, the components with a frequency above the fundamental wave to obtain a filtered signal; and these filtered signals flow through the rectifying module and are rectified in the diode D1 to obtain a periodic rectified current.

The low-pass filtering module includes a first resistor and a first capacitor; herein, a first end of the first resistor is connected with the first power amplification transistor, and a second end of the first resistor is connected with the rectifying module; and a first end of the first capacitor is connected between the second end of the first resistor and the rectifying module, and a second end of the first capacitor is grounded. The rectifying module includes a diode and a second resistor; herein, the forward direction end of the diode is connected with the second end of the first resistor, and the reverse direction end of the diode is connected with the second resistor in series.

The rectifying module includes a diode and a second resistor; herein, the forward direction end of the diode is connected with the second end of the first resistor, and the reverse direction end of the diode is connected with the second resistor in series.

As illustrated in FIG. 9, the reverse direction end of the diode D1 of the rectifying module is connected with the second resistor R2 in series. A first end of the first resistor R1 of the low-pass filtering module is connected with the drain of the first power amplification transistor MOS1 and a second end of the second resistor R2 of the rectifying module is connected with the drain of the bias transistor MOS0. A second end of the first resistor R1 is connected with the forward direction end of the diode D1 of the rectifying module, and a first end of the first capacitor C1 is connected between the second end of the first resistor R1 and the forward direction end of the diode D1, and a second end of the first capacitor C1 is grounded.

The radio frequency signal is a component such as a fundamental wave and higher harmonics; the low-pass filtering module is configured to filter out a first part of frequency components when there is the first part of frequency components with a frequency above the fundamental wave, in the components such as the fundamental wave and higher harmonics, and to take the remaining second part of frequency components after filtering as the filtered signal.

The diode of the rectifying module is configured to be turned on when the voltage amplitude of the received radio frequency signal is higher than a turn-on voltage of the diode; and to be turned off when the voltage amplitude of the received radio frequency signal is lower than the turn-on voltage of the diode.

As illustrated in FIG. 9, the radio frequency signal output by the power amplifier has frequency components that are different from that of the input signal, and include higher harmonics and intermodulation components, and when these components pass through the first resistor R1 and the first capacitor C1 of the low-pass filtering module, the first resistor R1 and the first capacitor C1 will filter out the components whose frequencies exceed a certain value, i.e., the preset fundamental wave, and then output the remaining components after filtering as a filtered signal to the diode D1 and the second resistor R2 of the rectifying module.

In FIG. 9, after the rectifying module receives the filtered signal, the component with frequency above the turn-on voltage of the diode in the remaining frequency components will turn on the diode D1 of the rectifying module. When the frequency of the received filtered signal is lower than the turn-on voltage of the diode, the diode D1 is turned off. Herein, the turn-on voltage of the diode is the value of the forward turn-on voltage of the diode D1.

The diode of the rectifying module is configured to convert the filtered signal into a periodic rectified current by rectification effect when it is turned on.

In FIG. 9, when the diode D1 of the rectifying module is turned on, since the turned-on time period is not a complete period of the radio frequency signal filtered by the low-pass filtering module, but is a time period when the voltage amplitude exceeds the forward turn-on voltage of the diode D1, therefore, after the rectification effect of the diode D1, the obtained DC component, i.e. the rectified current, is also periodical, and the period of the rectified current is less than the complete period of the radio frequency signal, and the rectified current exists in a time period with a large radio frequency amplitude under high power, that is with a large output power. Superimposing the periodic rectified current with the current $I_{bias}$ to flow into the drain of the bias transistor MOS0 periodically increases the current flowing in from the drain of the bias transistor MOS0.

At this time, when the current flowing in from the drain of the bias transistor MOS0 increases, the gate voltage $V_{gs}$ that controls the static operating point of the first power amplification transistor MOS1 will increase periodically, thus slowing down the drop of $V_{gs}$ with the increase of the input power.

According to a gain compression compensation circuit provided by the embodiment of the disclosure, the received radio frequency signal is filtered and rectified through the low-pass filtering module and the rectifying module of the circuit, and the obtained rectified current is superimposed with the current $I_{bias}$ to flow into the bias transistor. In this way, the signal $V_{gs}$ that controls the static operating point of the amplifier is increased by increasing the current of the bias transistor, thus compensating for the drop of the signal $V_{gs}$ in the transistor with the increase of the input power.

Figure 10:
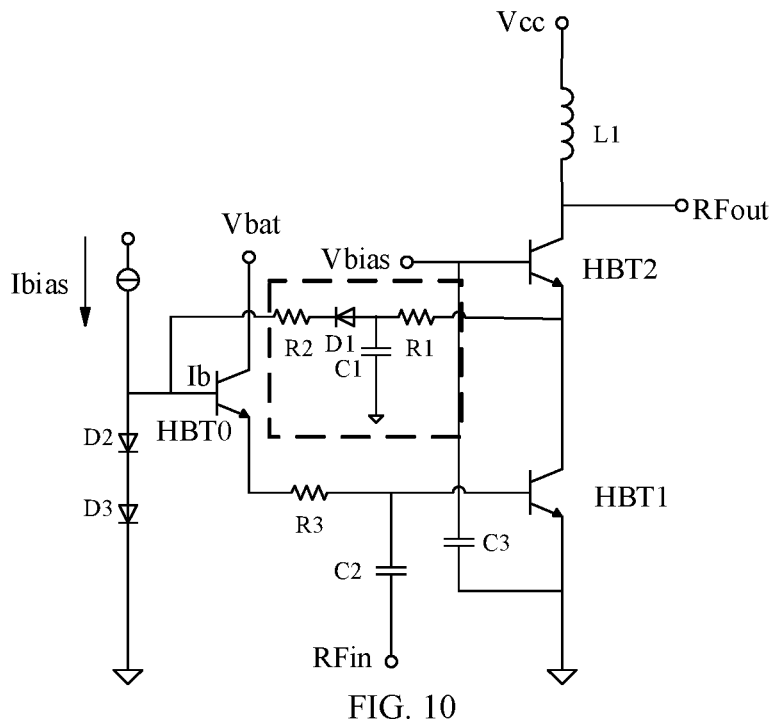
FIG. 10 is a schematic diagram of the structure of a gain compression compensation circuit of a conventional HBT PA provided by an embodiment of the disclosure.

An embodiment of the disclosure provides an implementation of the gain compression compensation circuit, as illustrated in FIG. 10.

Compared with MOS transistors, HBT transistors use current to drive amplification, while MOS transistors use voltage to drive amplification. The problems existing in MOS transistors also exist in HBT transistors, that is, the base current $I_b$ of HBT transistors that control the static operating point of the amplifier will drop non-linearly with the increase of $RF_{in}$.

The gain compression compensation technology of HBT PA provided by the embodiment of the disclosure also includes a low-pass filtering module and a rectifying module.

As illustrated in FIG. 10, the low-pass filtering module herein includes a first resistor R1 and a first capacitor C1, and the rectifying module includes a diode D1 and a second resistor R2. The first resistor R1 and the first capacitor C1 receive the radio frequency signal output by the collector of the first power amplification transistor HBT1, and filter out the signal component with a frequency above the fundamental wave to obtain a filtered signal. The diode D1 and the second resistor R2 receive the filtered signal output by the low-pass filtering module and rectify the filtered signal to obtain a rectified current; and then output the rectified current to a bias transistor HBT0, and the rectified current superimposes with a current $I_{bias}$ to flow into the base of the bias transistor HBT0.

The rectified current is a periodic current, and when the base current of the bias transistor HBT0 increases periodically, the rectified current is superimposed with the current $I_{bias}$ to flow into the base of the bias transistor HBT0, so that the current $I_b$ of the base of the bias transistor HBT0 increases periodically at this time, thus slowing down the drop with the increase of the input power.

According to a gain compression compensation circuit provided by the embodiment of the disclosure, the received radio frequency signal is filtered and rectified through the low-pass filtering module and the rectifying module of the circuit, and the obtained rectified current is superimposed with the current $I_{bias}$ to flow into the bias transistor. In this way, the base current $I_b$ that controls the static operating point of the amplifier is increased by increasing the base current of the bias transistor, thus compensating for the drop of $I_b$ in the transistor with the increase of the input power.

Figure 11:
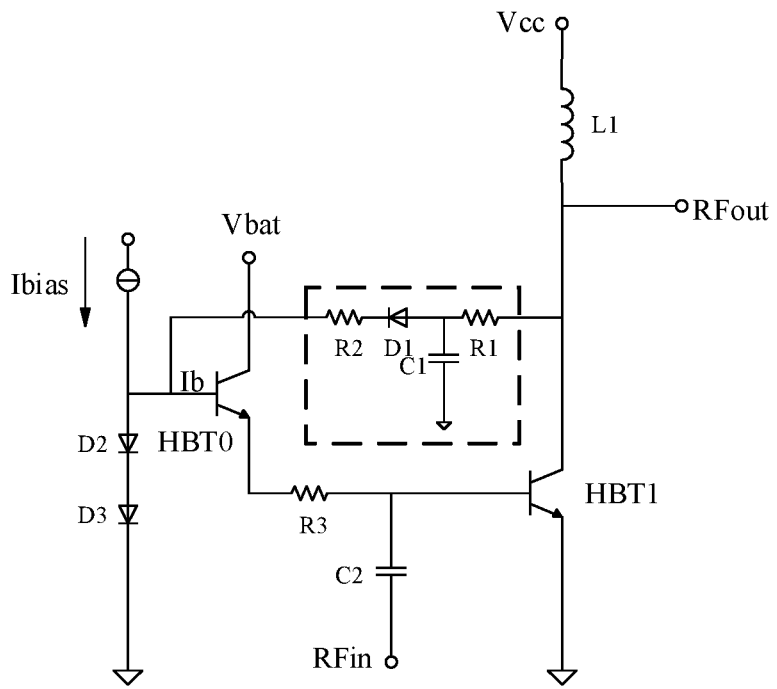
FIG. 11 is a schematic diagram of the structure of a gain compression compensation circuit of a single-transistor HBT PA provided by an embodiment of the disclosure.

The embodiment of the disclosure provides an implementation of the gain compression compensation technology, as illustrated in FIG. 11, and compared with the conventional HBT PA, such structure has omitted HBT transistors for radio frequency voltage division, and by default, the voltage or current flowing through the collector of HBT1 will not cause breakdown of HBT1, and it is applicable to the case of low output power.

As illustrated in FIG. 11, for a single-transistor HBT PA, a first end of the first resistor R1 is connected with the collector of the first power amplification transistor HBT1, and a second end of the second resistor R2 is connected with the base of the bias transistor HBT0. Multiple frequency components exist in the radio frequency signal received by the first resistor R1 and the first capacitor C1 of the low-pass filtering module, including higher harmonics and intermodulation components, and the first resistor R1 and the first capacitor C1 filter out the components with a frequency above the preset fundamental wave, that is, filter out the higher harmonics and intermodulation components to obtain a filtered signal; and these filtered signals flow through the diode D1 and the second resistor R2 of the rectifying module, and are rectified in the diode D1 to obtain a periodic rectified current.

When the diode D1 of the rectifying module is turned on, the DC component, i.e., the rectified current, is obtained from the filtered signal through the rectification effect of the diode D1, and the period of the DC component is less than a complete period of the above radio frequency voltage signal with a single frequency, and it mainly exists in the time period with a large output power. Superimposing such periodic rectified current with the current $I_{bias}$ to flow into the base of the bias transistor HBT0 periodically increase the current flowing in from the base of the bias transistor HBT0.

When the current flowing in from the base of the bias transistor HBT0 increases periodically, the $I_b$ that controls the static operating point of the first power amplification transistor HBT1 also increases periodically, thus slowing down the drop of the signal $I_b$ with the increase of the input power.

According to a gain compression compensation circuit provided by the embodiment of the disclosure, the received radio frequency signal is filtered and rectified through the low-pass filtering module and the rectifying module of the circuit, and the obtained rectified current is superimposed with the current $I_{bias}$ to flow into the bias transistor. In this way, the base current $I_b$ that controls the static operating point of the amplifier is increased by increasing the base current of the bias transistor HBT0, thus compensating for the drop of the $I_b$ in the first power amplification transistor HBT1 with the increase of the input power.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations, and it should be understood that the described program components and systems can generally be integrated together in a single software product or packaged into multiple software products.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

The above description includes part of embodiments of the present disclosure, and not limits the present disclosure. Any modifications, equivalent substitutions, improvements, etc., within the spirit and principles of the present disclosure, are included in the scope of protection of the present disclosure.

It is apparent that those of ordinary skill in the art can make various modifications and variations to the embodiments of the disclosure without departing from the spirit and scope of the disclosure. Thus, it is intended that the present disclosure cover the modifications and the modifications.

Various embodiments in this specification have been described in a progressive manner, where descriptions of some embodiments focus on the differences from other embodiments, and same or similar parts among the different embodiments are sometimes described together in only one embodiment.

It should also be noted that in the present disclosure, relational terms such as first and second, etc., are only used to distinguish one entity or operation from another entity or operation, and do not necessarily require or imply these entities having such an order or sequence. It does not necessarily require or imply that any such actual relationship or order exists between these entities or operations.

Moreover, the terms "include," "including," or any other variations thereof are intended to cover a non-exclusive inclusion within a process, method, article, or apparatus that comprises a list of elements including not only those elements but also those that are not explicitly listed, or other elements that are inherent to such processes, methods, goods, or equipment.

In the case of no more limitation, the element defined by the sentence "includes a . . . " does not exclude the existence of another identical element in the process, the method, or the device including the element.

Specific examples are used herein to describe the principles and implementations of some embodiments. The description is only used to help convey understanding of the possible methods and concepts. Meanwhile, those of ordinary skill in the art can change the specific manners of implementation and application thereof without departing from the spirit of the disclosure. The contents of this specification therefore should not be construed as limiting the disclosure.

For example, in the description of the present disclosure, the terms "some embodiments," or "example," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

In the descriptions, with respect to circuit(s), unit(s), device(s), component(s), etc., in some occurrences singular forms are used, and in some other occurrences plural forms are used in the descriptions of various embodiments. It should be noted; however, the single or plural forms are not limiting but rather are for illustrative purposes. Unless it is expressly stated that a single unit, device, or component etc.

is employed, or it is expressly stated that a plurality of units, devices or components, etc. are employed, the circuit(s), unit(s), device(s), component(s), etc. can be singular, or plural.

Based on various embodiments of the present disclosure, the disclosed apparatuses, devices, and methods can be implemented in other manners. For example, the abovementioned devices can employ various methods of use or implementation as disclosed herein.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

Dividing the device into different "regions," "units," "components" or "layers," etc. merely reflect various logical functions according to some embodiments, and actual implementations can have other divisions of "regions," "units," "components" or "layers," etc. realizing similar functions as described above, or without divisions. For example, multiple regions, units, or layers, etc. can be combined or can be integrated into another system. In addition, some features can be omitted, and some steps in the methods can be skipped.

Those of ordinary skill in the art will appreciate that the units, components, regions, or layers, etc. in the devices provided by various embodiments described above can be provided in the one or more devices described above. They can also be located in one or multiple devices that is (are) different from the example embodiments described above or illustrated in the accompanying drawings. For example, the units, regions, or layers, etc. in various embodiments described above can be integrated into one module or divided into several sub-modules.

The various device components, modules, units, blocks, or portions may have modular configurations, or are composed of discrete components, but nonetheless can be referred to as "modules" in general. In other words, the "components," "modules," "blocks," "portions," or "units" referred to herein may or may not be in modular forms.

Moreover, the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

The order of the various embodiments described above are only for the purpose of illustration, and do not represent preference of embodiments.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to the disclosed aspects of the exemplary embodiments can be made in addition to those described above by a person of ordinary skill in the art having the benefit of the present disclosure without departing from the spirit and scope of the disclosure contemplated by this disclosure and as defined in the following claims. As such, the scope of this disclosure is to be accorded the broadest reasonable interpretation so as to encompass such modifications and equivalent structures.

What is claimed is:

1. A gain compression compensation circuit of a radio frequency power amplifier, comprising:
   a low-pass filtering module configured to receive a part of radio frequency signals output from a first power amplification transistor, and to filter, from the part of radio frequency signals, radio frequency signals with a frequency above a fundamental wave to obtain a filtered signal; and the first power amplification transistor comprises a first metal oxide semiconductor field effect transistor (MOSFET) MOS1 or a first heterojunction bipolar transistor (HBT) HBT1; and
   a rectifying module configured to receive the filtered signal output by the low-pass filtering module and to rectify the filtered signal to obtain a rectified current; and to output the rectified current to a bias transistor and superimpose the rectified current with a current $I_{bias}$ to flow into the bias transistor;
   wherein the bias transistor comprises a second MOSFET MOS0 or a second HBT HBT0.

2. The circuit of claim 1, wherein
   the low-pass filtering module comprises a first resistor and a first capacitor;
   a first end of the first resistor is connected with the first power amplification transistor, and a second end of the first resistor is connected with the rectifying module; and
   a first end of the first capacitor is connected between a second end of the first resistor and the rectifying module, and a second end of the first capacitor is grounded.

3. The circuit of claim 2, wherein the first end of the first resistor is connected with the drain of the MOS1 or the collector of the HBT1.

4. The circuit of claim 2, wherein
   the rectifying module comprises a diode and a second resistor; and
   a forward direction end of the diode is connected with the second end of the first resistor, and a reverse direction end of the diode is connected with the second resistor in series, while the second resistor is connected with the bias transistor.

5. The circuit of claim 4, wherein the second resistor is connected with the gate of the MOS0 or the base of the HBT0.

6. The circuit of claim 2, wherein the low-pass filtering module is configured to filter, from feedback radio frequency signals of the first power amplification transistor, signals with a frequency above the fundamental frequency.

7. The circuit of claim 4, wherein the diode of the rectifying module is configured to be turned on when a voltage amplitude of a radio frequency voltage signal in the radio frequency signals received is higher than a turn-on voltage of the diode, and to be turned off when the voltage amplitude of the radio frequency voltage signal received is lower than the turn-on voltage of the diode.

8. The circuit of claim 4, wherein the diode of the rectifying module is configured to convert the filtered signal into a periodic rectified current through rectification effect.

9. The circuit of claim 1, further comprising a second power amplification transistor; the second power amplification transistor comprises a third MOSFET MOS2 or a third HBT HBT2;

wherein
the source of the MOS2 is connected with the drain of the MOS1; or,
the emitter of the HBT2 is connected with the collector of the HBT1.

10. The circuit of claim 9, wherein
the second power amplification transistor is configured to be connected with an external power supply and share an output radio frequency voltage with the first power amplification transistor.

11. A power amplifier comprising the circuit of claim 10 wherein the power amplifier is configured to dynamically compensate a voltage that controls a static operating point of the first power amplification transistor, thereby compensating a gain compression of the first power amplification transistor and the second power amplification transistor with an increase of an output power, and further ensuring that an operating point of the first and second power amplification transistors does not drop significantly at high power.

12. The power amplifier of claim 11, wherein
the low-pass filtering module comprises a first resistor and a first capacitor;
a first end of the first resistor is connected with the first power amplification transistor, and a second end of the first resistor is connected with the rectifying module; and
a first end of the first capacitor is connected between a second end of the first resistor and the rectifying module, and a second end of the first capacitor is grounded.

13. The power amplifier of claim 12, wherein the first end of the first resistor is connected with the drain of the MOS1 or the collector of the HBT1.

14. The power amplifier of claim 12, wherein
the rectifying module comprises a diode and a second resistor; and
a forward direction end of the diode is connected with the second end of the first resistor, and a reverse direction end of the diode is connected with the second resistor in series, while the second resistor is connected with the bias transistor.

15. The power amplifier of claim 14, wherein the second resistor is connected with the gate of the MOS0 or the base of the HBT0.

16. The power amplifier of claim 12, wherein the low-pass filtering module is configured to filter, from feedback radio frequency signals of the first power amplification transistor, signals with a frequency above the fundamental frequency.

17. The power amplifier of claim 14, wherein the diode of the rectifying module is configured to be turned on when a voltage amplitude of a radio frequency voltage signal in the radio frequency signals received is higher than a turn-on voltage of the diode, and to be turned off when the voltage amplitude of the radio frequency voltage signal received is lower than the turn-on voltage of the diode.

18. The power amplifier of claim 14, wherein the diode of the rectifying module is configured to convert the filtered signal into a periodic rectified current through rectification effect.

\* \* \* \* \*